United States Patent
Cam et al.

(10) Patent No.: US 9,143,124 B2
(45) Date of Patent: Sep. 22, 2015

(54) SWITCH CONTROLS

(71) Applicant: Acco, Louveciennes (FR)

(72) Inventors: Hervé Cam, Cernay-la-ville (FR); Stephanie Venec, Paris (FR); Filipe Dos Santos, Villiers-sur-Marne (FR)

(73) Assignee: ACCO, Louveciennes (FR)

( * ) Notice: Subject to any disclaimer, the term of this patent is extended or adjusted under 35 U.S.C. 154(b) by 110 days.

(21) Appl. No.: 14/183,215

(22) Filed: Feb. 18, 2014

(65) Prior Publication Data

US 2015/0236691 A1   Aug. 20, 2015

(51) Int. Cl.
*H01Q 13/00* (2006.01)
*H03K 17/687* (2006.01)
*H01Q 1/50* (2006.01)
*H01Q 13/02* (2006.01)
*H03D 7/12* (2006.01)
*H04M 1/725* (2006.01)
*H04W 24/00* (2009.01)

(52) U.S. Cl.
CPC .............. *H03K 17/687* (2013.01); *H01Q 1/50* (2013.01); *H01Q 13/02* (2013.01); *H03D 7/125* (2013.01); *H04M 1/72519* (2013.01); *H04W 24/00* (2013.01)

(58) Field of Classification Search
CPC ...... H01Q 13/02; H03D 7/125; H04W 24/00; H04M 1/72519
USPC ......................... 343/786; 455/333, 425, 550.1
See application file for complete search history.

(56) References Cited

U.S. PATENT DOCUMENTS

| | | | |
|---|---|---|---|
| 5,492,857 A | 2/1996 | Reedy et al. | |
| 5,572,040 A | 11/1996 | Reedy et al. | |
| 5,596,205 A | 1/1997 | Reedy et al. | |
| 5,973,363 A | 10/1999 | Staab et al. | |
| 6,804,502 B2 * | 10/2004 | Burgener et al. | 455/333 |
| 7,248,120 B2 | 7/2007 | Burgener et al. | |
| 7,459,988 B1 | 12/2008 | Iversen | |
| 7,613,442 B1 | 11/2009 | Kelly et al. | |
| 7,795,968 B1 | 9/2010 | Li et al. | |
| 7,890,891 B2 | 2/2011 | Stuber et al. | |
| 7,910,993 B2 | 3/2011 | Brindle et al. | |
| 8,008,988 B1 | 8/2011 | Yang et al. | |
| 8,129,787 B2 | 3/2012 | Brindle et al. | |

(Continued)

OTHER PUBLICATIONS

U.S. 8,174,303, 05/2012, Englekirk et al. (withdrawn).
(Continued)

*Primary Examiner* — Joseph Lauture
(74) *Attorney, Agent, or Firm* — Peters Verny, LLP

(57) ABSTRACT

Switches for use in RF devices are provided that offer a better balance of power losses and switching times than switches of the prior art. Switches of the present invention comprise a stack of transistors controlled a symmetric bias network. The stack of transistors includes an even number of transistors arranged in series, where every two successive transistors defines a pair. The bias network includes a symmetrically branching set of connections, where the gates of every pair of transistors are connected by a first connection having a first node, and two or more first nodes are connected by a second connection to a second node, and so forth. The symmetry of the bias network tends to reject even harmonics, and the rejection of even harmonics can be further enhanced by adding capacitors between the bias network and the stack of transistors at points of symmetry.

18 Claims, 8 Drawing Sheets

(56) References Cited

U.S. PATENT DOCUMENTS

| | | |
|---|---|---|
| 8,405,147 B2 | 3/2013 | Brindle et al. |
| 8,649,754 B2 | 2/2014 | Burgener et al. |
| 8,742,502 B2 | 6/2014 | Brindle et al. |
| 2005/0179506 A1 | 8/2005 | Takahashi et al. |
| 2011/0002080 A1 | 1/2011 | Ranta |
| 2011/0025408 A1 | 2/2011 | Cassia et al. |
| 2011/0074220 A1 | 3/2011 | Iijima et al. |
| 2011/0156819 A1 | 6/2011 | Kim et al. |
| 2011/0227637 A1 | 9/2011 | Stuber et al. |
| 2012/0038344 A1 | 2/2012 | Kim et al. |
| 2012/0313731 A1 | 12/2012 | Burgener et al. |
| 2013/0015717 A1 | 1/2013 | Dykstra |
| 2013/0064064 A1 | 3/2013 | Nobbe |
| 2013/0154088 A1 | 6/2013 | Cable et al. |
| 2013/0200873 A1 | 8/2013 | Wu |
| 2013/0208396 A1 | 8/2013 | Bawell et al. |
| 2013/0222075 A1 | 8/2013 | Reedy et al. |
| 2013/0273861 A1 | 10/2013 | See |
| 2013/0293280 A1 | 11/2013 | Brindle et al. |
| 2014/0167834 A1 | 6/2014 | Stuber et al. |
| 2014/0171010 A1 | 6/2014 | Olson |
| 2014/0184334 A1 | 7/2014 | Nobbe et al. |
| 2014/0184335 A1 | 7/2014 | Nobbe et al. |
| 2014/0184336 A1 | 7/2014 | Nobbe et al. |
| 2014/0184337 A1 | 7/2014 | Nobbe et al. |

OTHER PUBLICATIONS

U.S. Appl. No. 14/493,695, Herve Cam, Body Biasing for RF Switch Optimization, filed Sep. 23, 2014.

U.S. Appl. No. 14/531,754, Denis Masliah, Electronic Circuits including a MOSFET and a Dual-Gate JFET, filed Nov. 3, 2014.

U.S. Appl. No. 13/803,792, Alexandre G. Bracale, Electronic circuits including a MOSFET and a dual-gate JFET, filed Mar. 14, 2013.

Ahn et al., "Ultra Low Loss and High Linearity SPMT Antenna Switch using SOI CMOS Process," Proceedings of the 40th European Microwave Conference, 2010.

EP 14156704.0 Extended European Search Report, mailed Jul. 8, 2015.

U.S. Appl. No. 14/751,495, Hervé Cam, Multimode Operation for Differential Power Amplifiers, filed Jun. 26, 2015.

* cited by examiner

SWITCH CONTROLS

BACKGROUND

1. Field of Invention

The present invention relates generally to RF circuits and more particularly to switches usable for activating and deactivating RF paths, including switching an antenna between multiple transit paths, and other applications.

2. Related Art

FIG. 1 illustrates a prior art RF circuit 100 coupled to an antenna 110. The circuit 100 comprises a number of transit paths 120 and an antenna switch 130 that couples the antenna 110 to the several transit paths 120. Each transit path 120 includes a power amplifier 140 and a receiver amplifier 150 alternately joined to the antenna switch 130 by a switch 160. Within the antenna switch 130, each transit path 120 is switchably coupled to the antenna 110 by a series switch 170 and optionally also switchably coupled to ground by a parallel switch 180.

As shown in FIG. 1, when one transit path 120 is coupled to the antenna 110 (said to be in the ON mode), the series switch 170 for that transit path 120 is closed while the parallel switch 180 is open, whereas the switches 170, 180 are reversed for all other transit paths 120 (OFF mode). While the antenna switch 130 will work with only the serial switches 170, the addition of the parallel switches 180 provides greater isolation by grounding the transit paths 120 that are not in use.

Switches 170, 180 are commonly implemented with a number of transistors arranged in series, as illustrated by the prior art switches 200, 300 of FIGS. 2 and 3, described in more detail below, where the transistors are controlled together to alternately open and close. Series transistors are sometimes referred to as a stack. The gates of the transistors in the stack are controlled by a high-resistance bias network. A series switch 170, when in the ON mode, is floating and has almost a 0V voltage drop across it, the transistors behaving as resistors in series. When the series switch 170 is in the OFF mode, each transistor behaves effectively as a capacitor with the input side of the series of transistors is grounded through the parallel switch 180 while the output side of the series of transistors sees the entire RF voltage swing, since the output side of every series switch 170 is connected to a common node 190 before the antenna 110. If the voltage at the common node 190 is the RF voltage (VRF), and if the series switch 170 includes N transistors, then VRF/N must be kept below the breakdown voltage of the transistors.

The overall capacitance of a transistor between source and drain, when off, is the contribution of the source to gate, drain to gate, source to channel, and drain to channel capacitances. The product of the resistance in the ON mode (Ron) and the capacitance in the OFF mode (Coff) of the stack in this RF domain yields a Figure of Merit (Ron*Coff) which represents the RF performance of the switch. Another metric of the transistors in a switch 170, 180 is their gate capacitance, the capacitance of the gates to the bias network in the DC domain used to control the transistors. The switching speed to open or close a switch 170, 180 is proportional to the time constant, the product of the gate capacitance and the resistance of the bias network.

FIGS. 2 and 3 provide two examples of prior art switches 200, 300 commonly implemented in CMOS. Both switches 200, 300 include multiple transistors in series, and are suitable for use as either serial or parallel switches 170, 180. In a first example, shown in FIG. 2, the switch 200 includes multiple transistors 210 arranged in series, source to drain. A resistor 220 is associated with each of the multiple transistors 210, the resistor 220 for a given transistor 210 being connected in parallel between the source and the drain of that transistor 210. The gates of the multiple transistors 210 are controlled together by a bias network comprising a common control line 230 and a number of resistors 240, where each transistor 210 is connected to the common control line 230 by one of the resistors 240. In the configuration of FIG. 2, the switching time is a function of the product of the gate capacitance and the resistance of the bias network. All transistors 210 are controlled together, so the switching time is optimum.

FIG. 2 also shows an equivalent circuit 250 to represent the switch 200 in the OFF mode to illustrate the power loss through the bias network. It is noted that the resistors 220 in the switch 200 are omitted from the equivalent circuit 250, for simplicity. In circuit 250, each transistor 210 is represented by two capacitors, one for the capacitance on the source side of the gate and the other for the capacitance on the drain side of the gate. Since the entire RF voltage (VRF) is distributed across the stack of 6 transistors 210, each capacitor 255 in the equivalent circuit 250 sees 1/12 of the VRF, as shown. Power, in electrical circuits, is proportional to the square of the voltage and inversely proportional to the resistance ($V^2/2R$). As illustrated, at one end of the stack a resistor 240 sees all of the VRF less the (1/12)VRF dissipated across one half of the associated transistor 210, hence it sees (11/12)VRF. The voltage seen be each successive resistor 240 in the stack is lower by (1/6)VRF until the last resistor 240, which sees only (1/12) VRF. The power loss due to each resistor 240 of the bias network therefore depends on its position relative to the stack.

In the example of FIG. 2, where there are 6 transistors 210 in series, the power loss for each resistor 240 is summed to arrive at the overall loss. In this example, the denominator (2R) is the same for each term, and the numerator is the sum of the squares of the voltages which is $(11^2/12^2+9^2/12^2+7^2/12^2+5^2/12^2+3^2/12^2+1/12^2)VRF^2$. This can be generalized for N resistors to $((2N-1)^2+ \ldots +5^2+3^2+1))VRF^2/(2N)^2$. With increasing numbers of transistors 210 the sum of the squares $((2N-1)^2+ \ldots )$ dominates over the squared term $(2N)^2$, thus, the overall power loss increases for each additional transistor 210 in the stack.

In a second example, shown in FIG. 3, a switch 300 also includes multiple transistors 210 arranged in series, source to drain. Similarly, a resistor 220 is associated with each of the multiple transistors 210, with the resistor 220 for a given transistor 210 is connected in parallel between the source and drain of that transistor 210. The bias network in this example also comprises one resistor 240 for each transistor 210, however, in this configuration the resistors 240 are connected in series along the control line 230. The first resistor 240 is disposed between the first gate and the DC control (not shown), the second resistor 240 is disposed between the first and second gates, and so forth, as illustrated.

The example of FIG. 3 is optimized to minimize power loss as the voltage drop across each resistor 240 is about the same, VRF/6, except for the first one in the series which sees a voltage drop of only VRF/12, as shown in the equivalent circuit 350 in FIG. 3. Therefore, the power loss becomes a constant and does not depend on the number of transistors 210 in series as the number of transistors 210 in the stack is increased. While power loss is minimized, switching time suffers in the example of FIG. 3 because the transistors 210 open progressively from one end of the stack to the other.

Another parameter of switches 200, 300 that depends on the number of transistors 210 in the stack is the linearity of the switch 200, 300. For some switches 200, 300, the linearity requirement can be very high, such as for antenna switches 130 since the antenna switch 130 is typically the last component prior to the antenna 110. Without filtering between the antenna switch 130 and the antenna 110, spurious and/or harmonic signals at the antenna 110 can interfere with the intended signal. As an example, the second harmonic of band 17 can fall into the GPS receive band and therefore about 110 dBc of harmonic rejection is required.

The number of transistors 210 in a stack of a switch 170, 180 of an antenna switch 130 is generally dictated by the minimum number of transistors 210 necessary to handle the required power and the minimum number necessary to provide the desired linearity of the switch 170, 180, whichever is larger. Given a required number of transistors, switching time and power loss are then balanced using the resistance of the bias network as the variable. In the case of switching time, decreasing resistance decreases the switching time proportionally. However, power loss scales as the inverse of the resistance, so decreasing resistance increases the power losses of the bias network.

SUMMARY

An exemplary switch of the present invention comprises a stack of transistors and a bias network. The stack of transistors includes an even number of transistors arranged in series, where each transistor has a source, a drain, and a gate, and where every two successive transistors in the stack defines a pair of transistors. In various embodiments, the number of transistors is at least 2, and can be 4, 6, 8, 10, 12, 14, 16, 18, 20, or any even number above 20. In various embodiments the switches are defined in CMOS and optionally on a silicon-on-insulator (SOI) die.

The bias network includes a control line and various connections between the gates of the transistors of the stack. Various connections can include resistors. The bias network, in some embodiments, is symmetric such that half of the transistors are disposed on either side of a line of symmetry and the electrical paths along the various connections through the bias network to any two transistors located the same distance from that line of symmetry are topologically equivalent. The connections within the bias network include a first connection connecting the gates of the two transistors in each pair of transistors. The first connection for each such pair includes a first node disposed between the two transistors' gates, and optionally includes first and second resistors, of the same resistance, connected in series between the two gates such that the first node is disposed between the first and second resistors. Resistors of this first connection of the several pairs are collectively sometimes referred to as first-level resistors.

The bias network also includes, for two pairs of transistors, a second connection connecting the first nodes, where the second connection includes a second node coupled to the control line. In some embodiments, the second connection connects the first node of a third pair of transistors to the first nodes of the two pairs of transistors. In these embodiments, the three pairs of transistors sharing the second connection are three consecutive pairs. Each second connection can also include a resistor between the second node and each first node. Resistors of this second connection are collectively sometimes referred to as second-level resistors. Various embodiments can couple the second node to the control line through additional layers to scale to higher numbers of pairs of transistors. For example, pairs of second nodes can be connected by a third connection having a third node coupled to the control line, third nodes can be connected by a fourth connection having a fourth node coupled to the control line, and so forth. Embodiments of the present invention can also comprise a top-level resistor disposed between the control line and a DC control.

In various embodiments, the switch includes a central pair of transistors where the transistors of the central pair are on either side of the line of symmetry. In some of these embodiments, for the central pair of transistors, the first node is connected by a capacitor to a drain of one transistor of the pair and to a source of the other transistor of the pair. Some of these embodiments further include additional capacitors associated with pairs of transistors that are arranged symmetrically around the central pair. In these embodiments, each additional capacitor connects the first node of the associated pair of transistors to the drain of one transistor of that pair and to the source of the other transistor of that pair.

The present invention also provides RF devices that include switches as described above. An exemplary RF device comprises a plurality of power amplifiers, an antenna, and an antenna switch configured to couple one of the plurality of power amplifiers at a time to the antenna. The antenna switch includes a serial switch for each power amplifier of the plurality of power amplifiers. Each serial switch comprises a switch as described above. In some embodiments the antenna switch is defined on a silicon-on-insulator die. Also, in some embodiments, the power amplifiers are defined on a first die and the antenna switch is defined on a second die that is different than the first die and may be a silicon-on-insulator die.

DETAILED DESCRIPTION

The present invention describes switches for use in RF applications such as phase shifters, step attenuators, and as serial 170 and parallel 180 switches in antenna switches 130, for example. The switches of the present invention provide a better balance of power losses in the OFF mode and switching times than the switches 200, 300 of the prior art. In some embodiments, switches of the present invention also provide second harmonic rejection by changing the single ended type RF signal between source and drain, as in the switches 200, 300 of FIGS. 2 and 3, to a differential one at gate level, due to the bias network symmetry.

Figure 4:
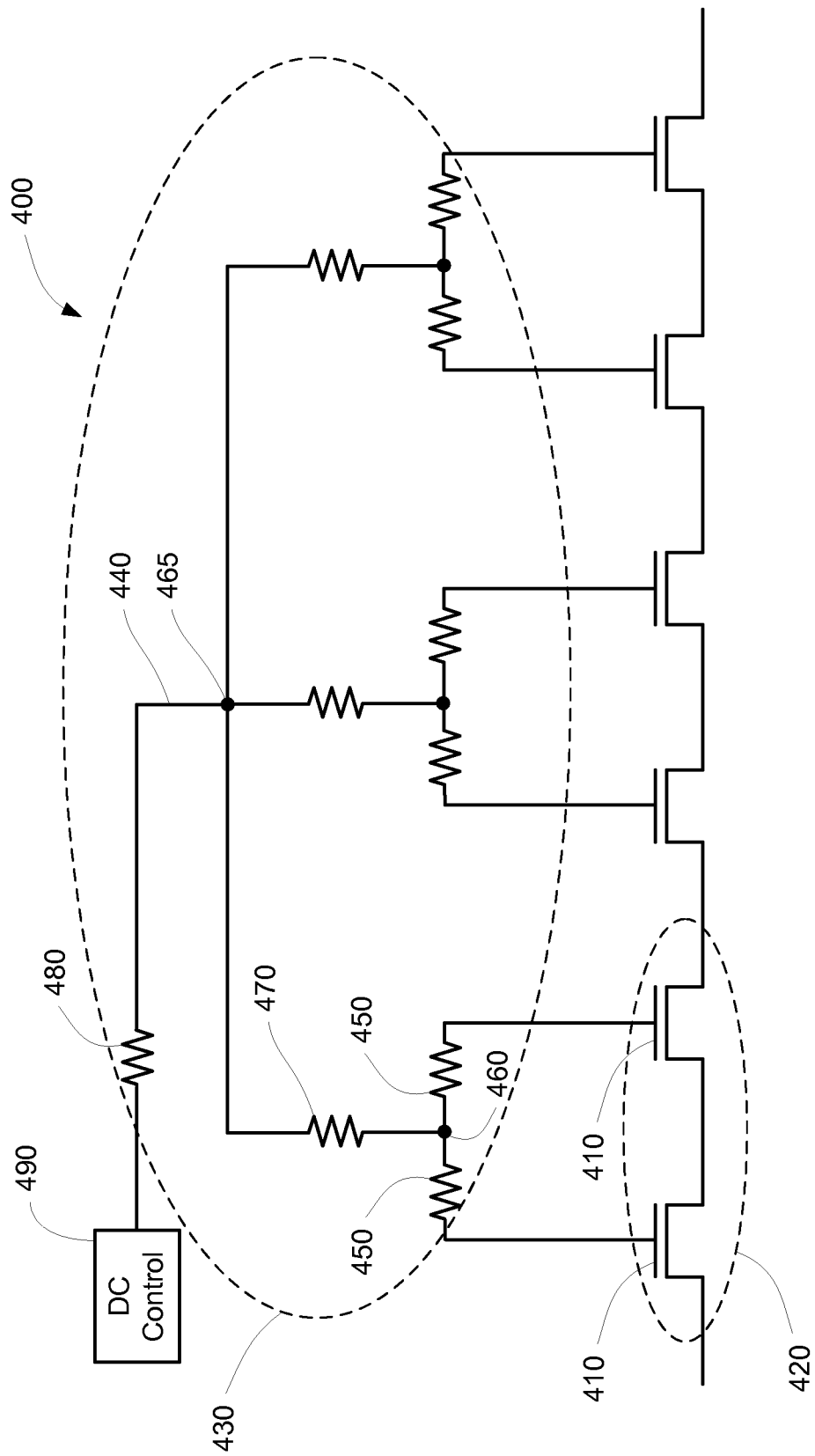
FIG. 4 is a schematic representation of a switch according to an exemplary embodiment of the present invention.

FIG. 4 illustrates an exemplary switch 400 of the present invention. The switch 400 comprises an even number of transistors 410 arranged in series, where every two successive transistors 410 defines a pair 420 of transistors 410 such that the stack has half as many pairs 420 as transistors 410. The switch 400 also comprises a bias network 430 that controls the transistors 410 to open and close in unison. The bias network 430 includes a control line 440 and, for each pair 420, a first electrical connection between the gates of the two transistors 410, so that the gates are controlled together. The first connection includes, in the embodiment of FIG. 4, two optional resistors 450 in series connecting the gates of the two transistors 410, and a first node 460 disposed between the two resistors 450.

The bias network also comprises a second connection connecting two or more of the first nodes 460, all three of the first nodes 460 in the illustrated embodiment. The second connection includes a second node 465 coupled to the control line 440 such that the first nodes 460 are connected in parallel to the second node 465. Each second connection can also include a resistor 470 in series between the second node 465 and each first node 460. Resistors 470 of this second connection are collectively sometimes referred to as second-level resistors. While in this embodiment the second node 465 is coupled directly to the control line 440, other embodiments such as the one illustrated by FIG. 6 can couple the second node 465 to the control line 440 through additional layers to scale to higher numbers of pairs 420 of transistors 410. For example, second nodes 465 can be connected by a third connection having a third node coupled to the control line 440, third nodes can be connected by a fourth connection having a fourth node coupled to the control line 440, and so forth.

A resistor 480 connects the control line 440 to a low impedance DC control 490 and the resistor 480 keeps the control line 440 floating. Since each node 460 is connected to the same DC point, each pair 420 is controlled together for fast switching speed. When the switch 400 is in the OFF mode, the transistors 410 behave as capacitors in series between ground and the voltage on the other side of the stack, in the case of a serial switch 170 that voltage is the RF signal and therefore the RF signal becomes capacitively coupled to the gates of the transistors 410. The control line 440 becomes a virtual ground for the RF signal and the even harmonics H2, H4, etc., which are dissipated through the resistor 480, due to the symmetry of the bias network relative to the control line 440, as discussed further below. The design of the bias network 430 both keeps the gates of the transistors 410 at a very high impedance and makes a transition from these high impedances points to the ideal ground at the DC control 490.

Figure 2:
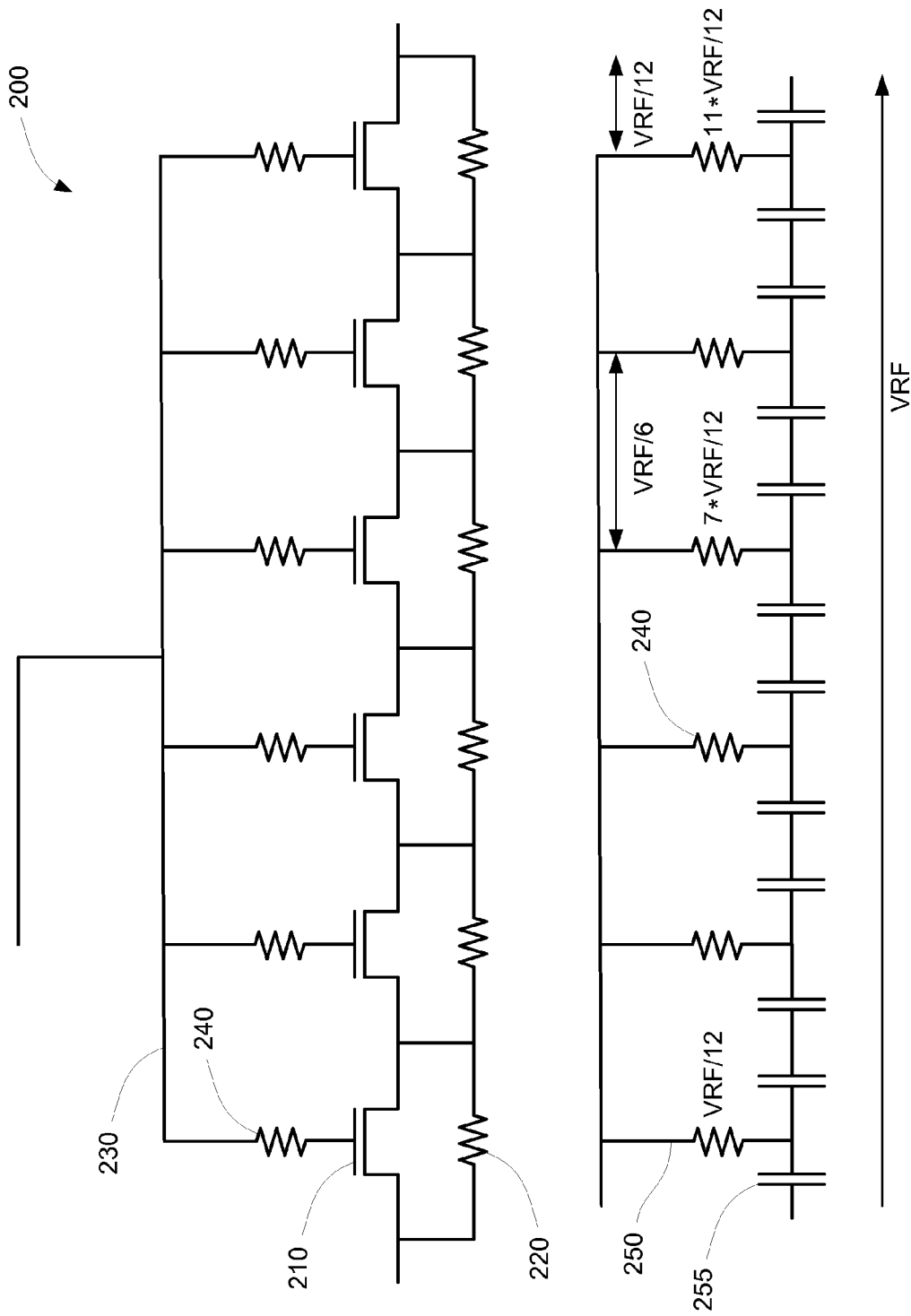
FIGS. 2 and 3 are schematic representations of prior art switches usable as part of an antenna switch within the structure of FIG. 1.
Figure 3:
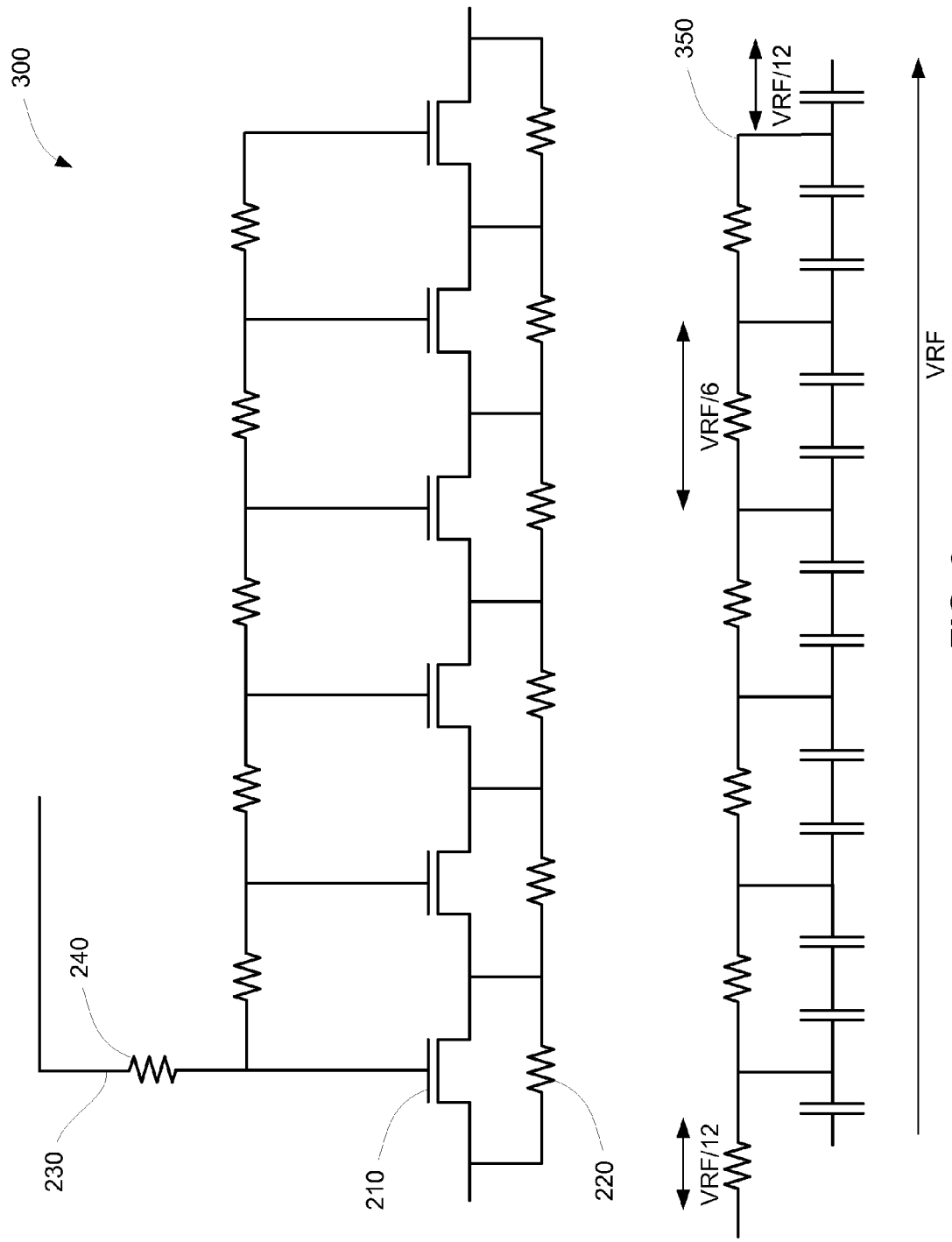

The switching time and the power loss is more complex to calculate in the switch 400 of FIG. 4, as compared to the prior art examples of FIGS. 2 and 3. For one reason, while the resistances of the resistors 450, 470, 480 within any given layer, such as the resistors 450, are all the same, the values of the resistances of the resistors between the layers can vary such that the resistance of resistor 480 is different than that of the resistors 470 and both are different than the resistance of the resistors 450, for example. Thus, the RF signal in the bias network 430 is progressively filtered by the successive layers of resistors 450, 470, and 480 with the layer of resistors 450 serving as a first line of filtering, and the layer of resistors 470 as the next line, with resistor 480 completing the filtering. It will be appreciated by those of ordinary skill in the art that the switch 400 can provide faster switching than the prior art switch 200 of FIG. 2 and lower losses than the prior art switch 300 of FIG. 3 for larger numbers of transistors 410.

Figure 5:
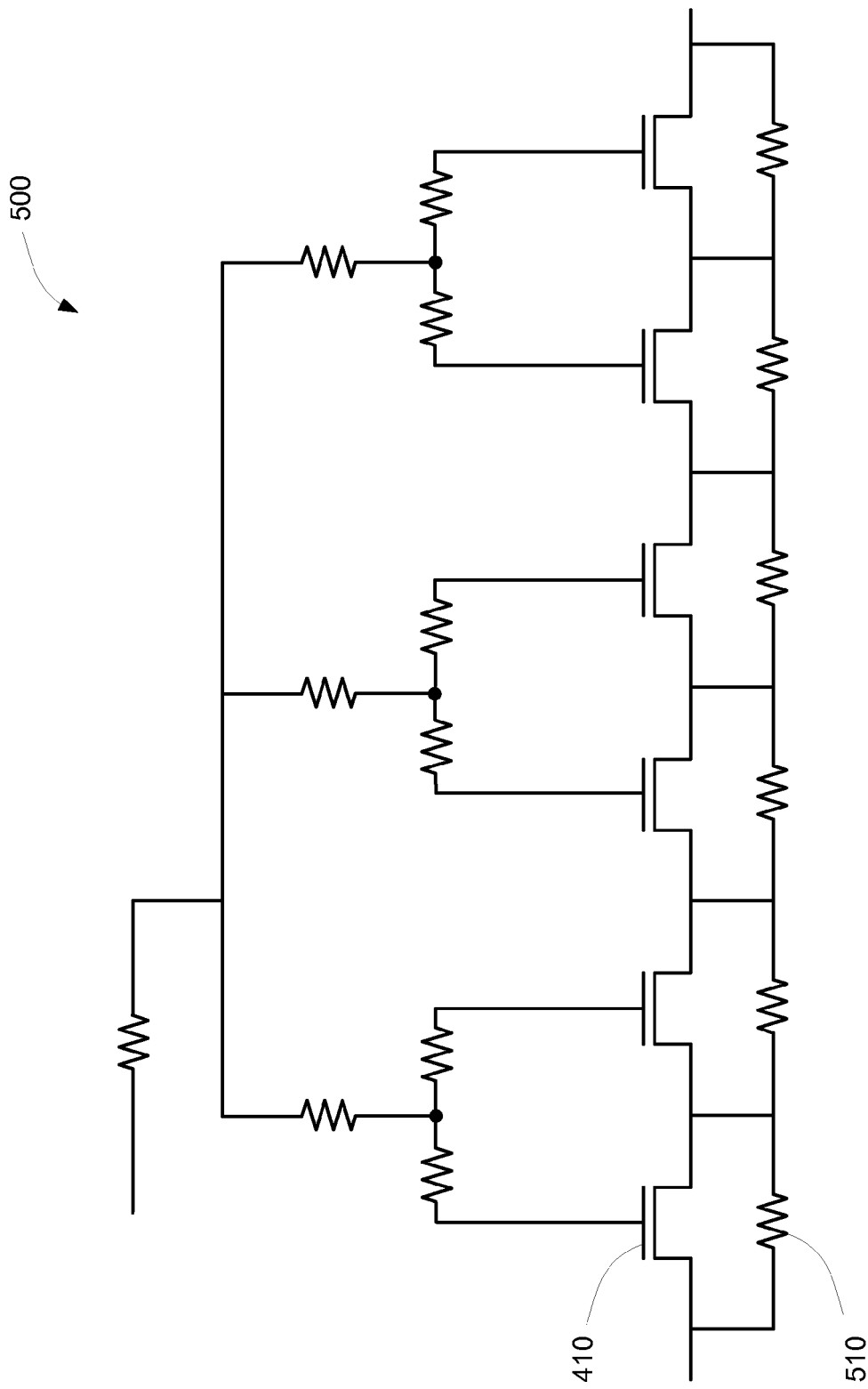
FIG. 5 is a schematic representation of a switch according to another exemplary embodiment of the present invention.

FIG. 5 illustrates another exemplary switch 500 of the present invention that adds to the switch 400, for each transistor 410 thereof, a ladder resistor 510 connected in parallel between the source and the drain of that transistor 410. The ladder resistors 510 ensure that when the stack is in the OFF mode, the gates and sources of the transistors 410 are grounded. Absent the ladder resistors 510, some transistors 410 in the middle of the stack may not be fully off, when the stack is otherwise in the OFF mode, which can decreases the overall isolation of the switch 400. As used herein, the term "ladder" is used to identify the resistors 510 but is not meant to denote any further structure of feature that would make the resistors 510 distinguishable from any other resistors.

Figure 6:
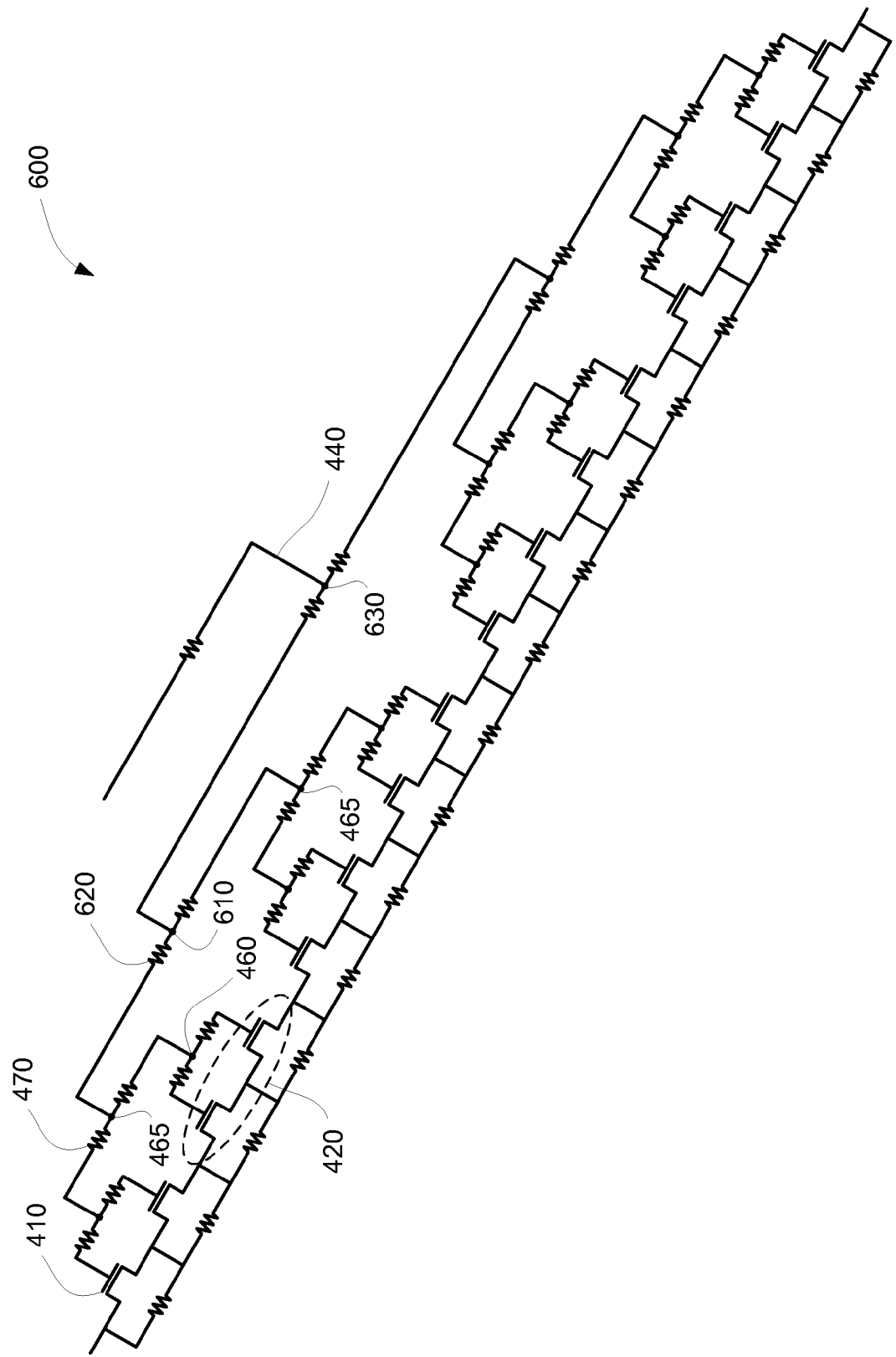
FIG. 6 is a schematic representation of a switch according to another exemplary embodiment of the present invention.

The concepts embodied in the exemplary switches 400, 500 can be extended to greater numbers of transistors 410 in the stack to permit higher linearity and/or to permit higher amounts of power. FIG. 6 illustrates another exemplary switch 600 of the present invention consisting of a stack of 16 transistors 410 defining 8 pairs 420. In embodiments such as this one, where the number of transistors 410 is at least 8, two or more second nodes 465 are joined by a third connection including a third node 610 that is coupled to the control line 440 by an optional fourth resistor 620. As in FIG. 4, the second connection can include second-level resistors 470 disposed between the second node 465 and each of the first nodes 460. In the embodiment shown in FIG. 6, having 16 transistors 410, the second four pairs 420 are similarly joined to the first four pairs 420 by a fourth connection between the third nodes 610, the fourth connection including a fourth node 630 coupled to the control line 440. The illustrated embodiment includes a ladder resistor 510 associated with each of the multiple transistors 410 and connected in parallel between the source and the drain of that transistor 410, however, other embodiments omit these ladder resistors 510 analogously to the switch 400 of the embodiment of FIG. 4. It will be appreciated that the switches described herein are single-ended at the source-drain level and can be seen as differential referred to the virtual ground at control line 440. As used herein, a circuit is differential when it is configured to transmit information electrically using two complementary signals on two paired electrical paths, whereas a circuit is single-ended when only one electrical path of a pair is used to transmit the signal and the other electrical path maintains a reference voltage such as ground.

Figure 7:
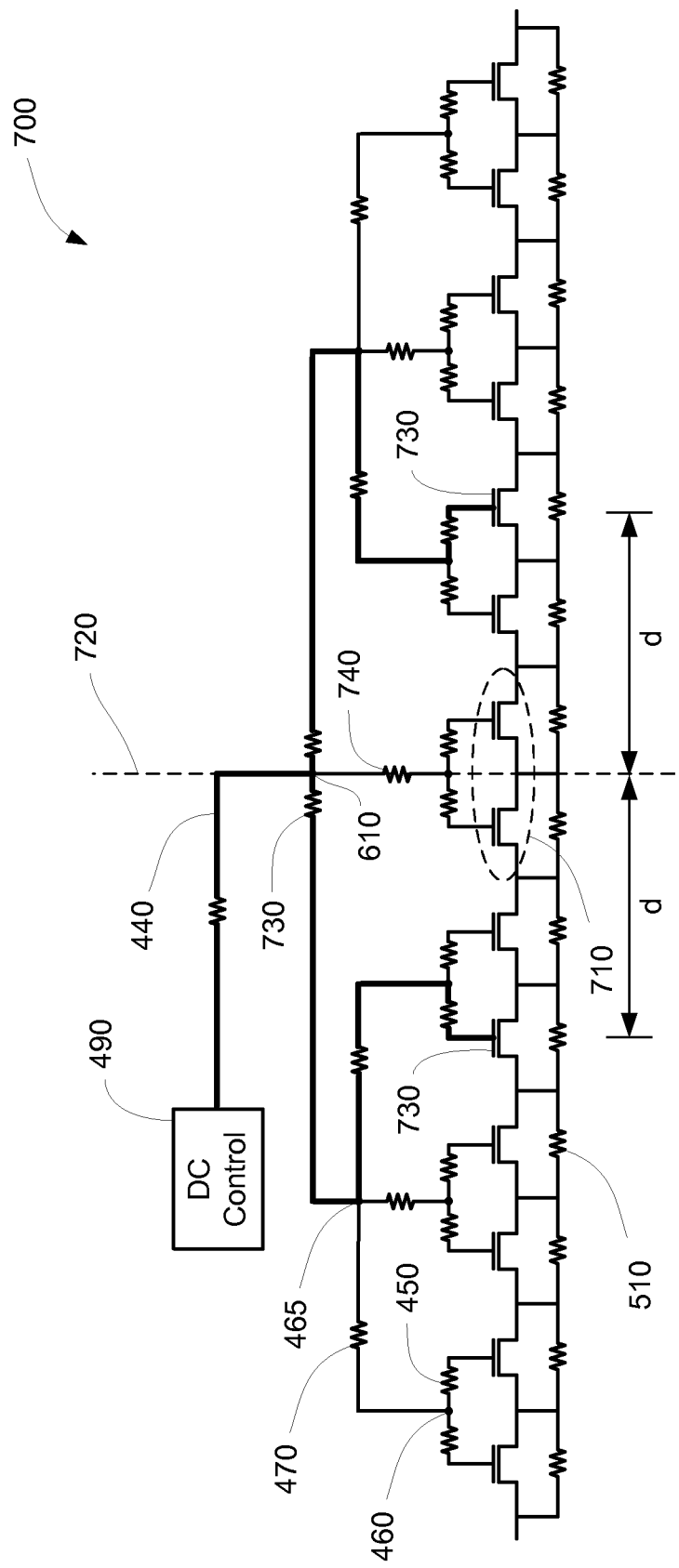
FIG. 7 is a schematic representation of a switch according to another exemplary embodiment of the present invention.

FIG. 7 illustrates still another exemplary switch 700 of the present invention consisting of 14 transistors 410 in series. As in the previous embodiments, every two successive transistors 410 defines a pair 420 of transistors 410. The bias network is arranged such that the gates of the transistors 410 of each pair 420 are connected by a first connection having a first node 460 therebetween. The first nodes 460 of the first three consecutive pairs 420 are connected by a second connection including a second node 465, where the three first nodes 460 are arranged in parallel from the second node 465. The same arrangement applies to the last three pairs 420. The first connections can include first-level resistors 450 between the gates and each first node 460, and the second connection can include second-level resistors 470 between the first nodes 460 and each second node 465, as illustrated.

In the embodiment of FIG. 7, a central pair 710 of transistors 410 is disposed between the two sets of three pairs 420 just described, with the gates of the transistors 410 connected with a first node 460 between the two gates, as illustrated. A pair 420 is a central pair 710 when the transistors 410 thereof are bisected by a line of symmetry 720. A line of symmetry 720 exists in a bias network, and the bias network is said to be symmetric, when half of the transistors 410 can be disposed on either side of a line of symmetry 720 and the electrical paths along the various connections through the bias network to any two transistors 410 located the same distance from the line of symmetry 720 are topologically equivalent. For example, two transistors 730 are the same distance, d, from the line of symmetry 720 and the electrical paths, shown in bold, from the DC control 490 to each transistor 730 are topologically equivalent, defined herein to mean that the resistance profile of each electrical path is the same. The resistance profile describes the arrangement of resistors, and their resistances, between the DC control 490 and the gate of the transistor 410 along the electrical path. One way to ensure that two electrical paths have the same resistance profile is to have their physical layouts be mirror images of one another with resistors having the same resistances placed at the same locations along both.

It will be appreciated that in the embodiment of FIG. 4 the bias network is also symmetric, in that a line of symmetry 720 can be drawn such that half of the transistors 410 are on one side of a line of symmetry 720 and the other half of the transistors 410 are on the other side of the line of symmetry 720, but there is no central pair 710.

Returning to the embodiment of FIG. 7, the two second nodes 465 are connected by a third connection having a third node 610, and the third connection also connects the first node 460 of the central pair 710 to the third node 610. The third connection can optionally include third-level resistors 730 between the third node 610 and each of the second nodes 465. The third connection can also optionally include a resistor 740 between the third node 610 and the first node of the central pair 710. The resistor 740 can be a second-level resistor or a third-level resistor, in different embodiments, but in some embodiments can also have a resistance value that is different than either the second-level and third-level resistors. The illustrated embodiment includes a ladder resistor 510 associated with each of the multiple transistors 410 connected in parallel between the source and the drain of that transistor 410, however, other embodiments omit these ladder resistors 510 analogously to the embodiment of FIG. 4.

Figure 8:
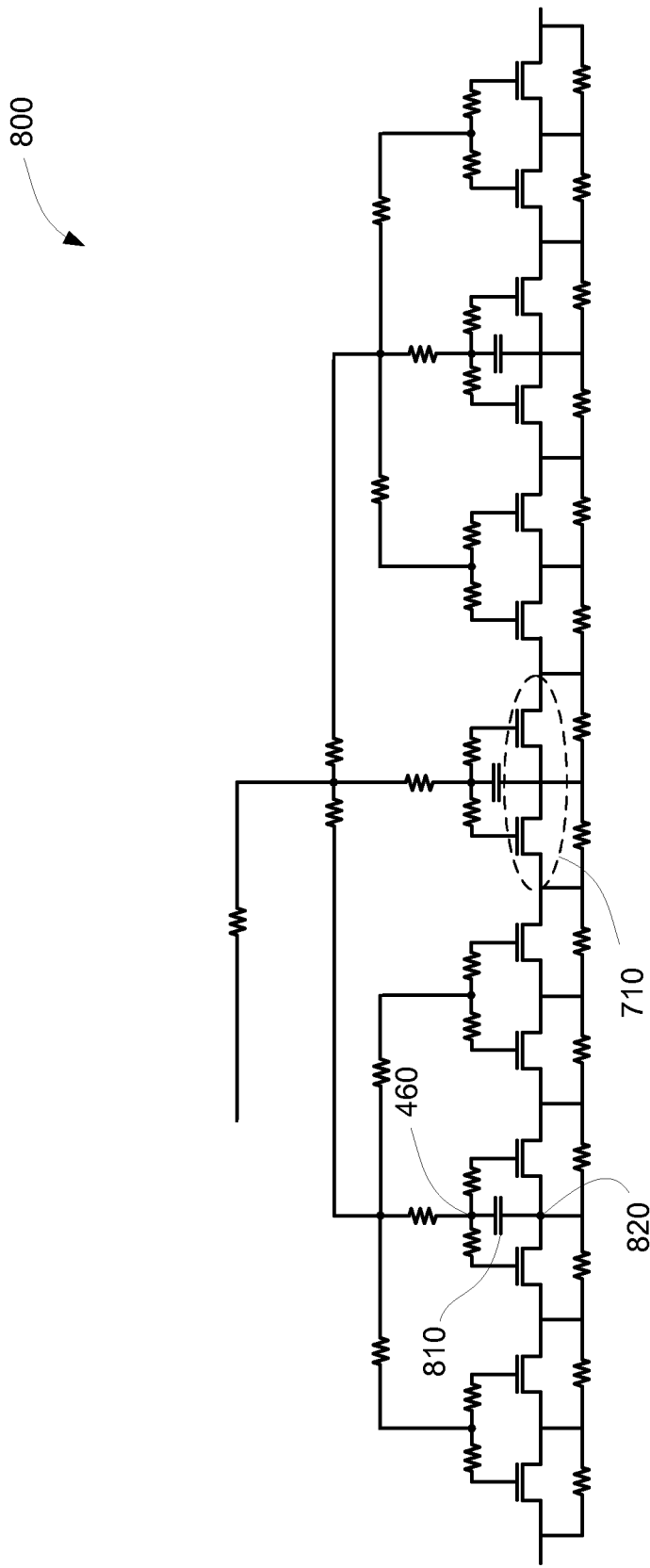
FIG. 8 is a schematic representation of a switch with improved linearity according to another exemplary embodiment of the present invention.

FIG. 8 illustrates yet another exemplary switch 800 of the present invention. This embodiment adds to the switch 700, for some pairs 420, a capacitor 810 connected between the first node 460 and the joined source and drain 820 of the transistors 410 of the pair 420. In the illustrated example, the central pair 710 includes a capacitor 810 as does the middle pair 420 of each of the two sets of three pairs 420. Some embodiments only have a capacitor 810 associated with the central pair 710 of resistors 410. In those embodiments with more capacitors 810 than just the one for the central pair 710, every further capacitor 810 has another paired capacitor 810 so that the two further capacitors 810 are disposed within pairs 420 arrange symmetrically around the central pair 420. The embodiment of FIG. 8 illustrates these principles. Further, in FIG. 8, the two pairs 720 on either side of the central pair 710 that each include a capacitor 810 are the middle pairs 420 within each set of three pairs 420 joined to a common second node 465, creating a symmetry within each such set. The capacitor 810 along the line of symmetry 720 associated with the central pair 710 helps to ensure that the RF signals induced in the bias network are symmetric on either side of the line of symmetry 720. Symmetrically adding additional capacitors 810 on either side improves this symmetry.

The symmetry of the bias network in the foregoing embodiments helps to cancel even harmonics of the RF signal such as H2, H4, etc. that can otherwise arise in a bias network in the OFF mode. Harmonics are created due to signal distortion, where the harmonic level depends on the voltage amplitude across the device. Distortions arise because of the non-linear capacitances measured gate to source, gate to drain body to source, and body to drain. The bias networks of the present invention, by virtue of being symmetric, are differential structures that naturally reject even harmonics. Filtering higher order harmonics, if required, becomes then easier and the impact of the H3 filter on the switch losses is minimized.

Figure 1:
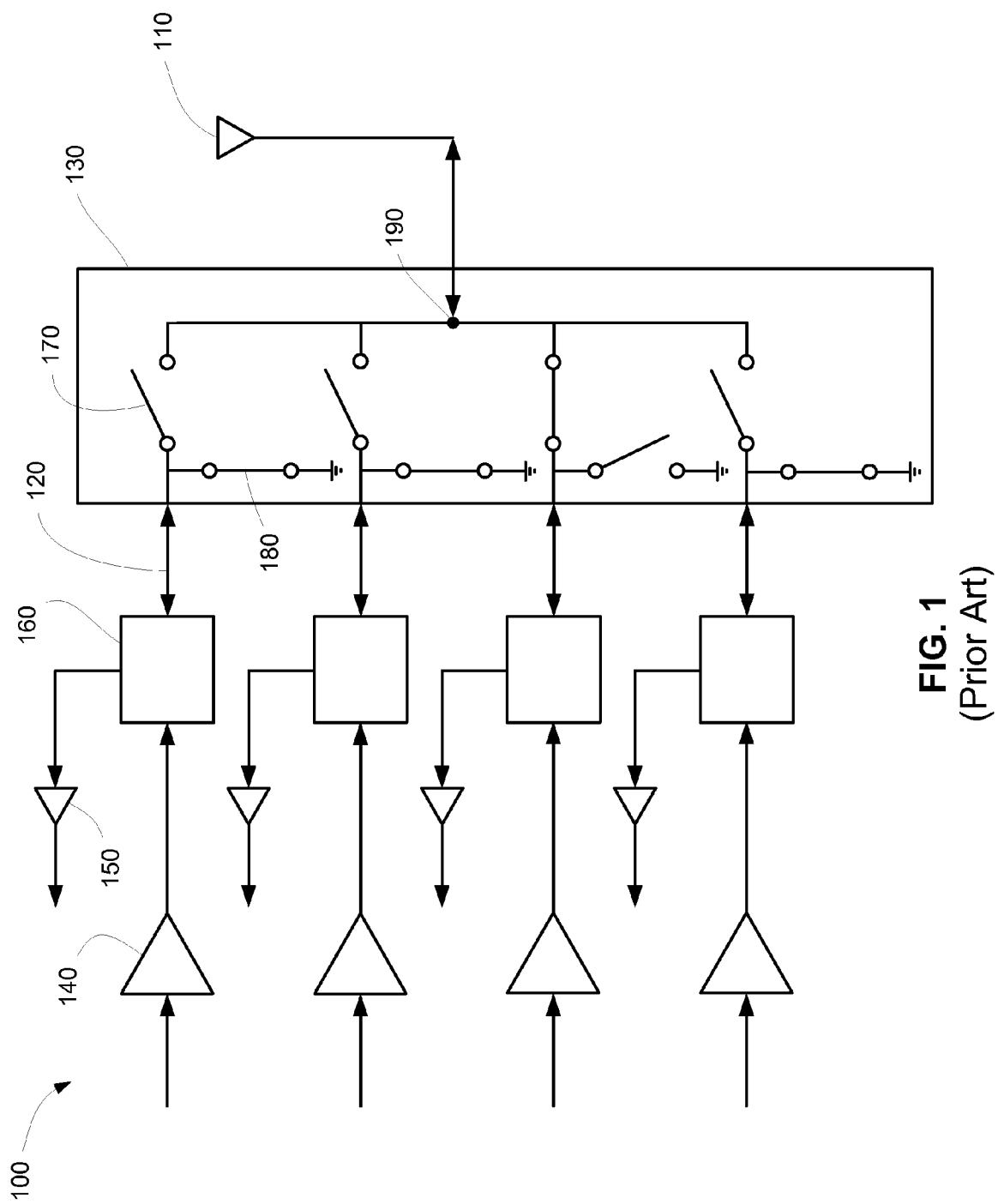
FIG. 1 is a schematic representation of RF transceiver according to the prior art.

The various switches of the invention can be incorporated into antenna switches 130 for use in wireless RF devices such as smartphones (FIG. 1). In the various embodiments of the invention described above, the antenna switches 130 can be defined in CMOS and in further embodiments can be defined in a silicon-on-insulator (SOI) die or defined in an amorphous material such as sapphire. In some embodiments, the die including the antenna switch 130 can be a separate die from the die including the power amplifiers 140, while in other embodiments the antenna switch is integrated onto the same die as the power amplifiers 140. Integration into a single die can improve the performance of the power amplifier 140.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art. The term "connect" is differentiated herein from the term "couple" such that when two components are "connected" there are no other components disposed between them, whereas when two components are "coupled" there may be other components disposed between them.

What is claimed is:

1. A switch comprising:
   an even number of transistors arranged in series, each transistor of the number of transistors having a source, a drain, and a gate, every two successive transistors defining a pair of transistors, the number of transistors being at least 4; and
   a bias network including
     a control line,
     for each pair of transistors,
       a first connection, including a first node, connecting the gates of the two transistors, the first connection including two first-level resistors, of equal resistance, disposed in series between the gates of the pair of transistors, and
     for two pairs of transistors a second connection including a second node connecting the first nodes, the second node being coupled to the control line.

2. The switch of claim 1 wherein the bias network is symmetric,
   wherein half of the transistors are on one side of a line of symmetry and the other half of the transistors are on the other side of the line of symmetry, and
   wherein the electrical paths through the bias network from a DC control to any two transistors located at a same distance from the line of symmetry are topologically equivalent.

3. The switch of claim 1 wherein each second connection between the second node and each first node comprises a second-level resistor of a same resistance.

4. The switch of claim 1 further comprising a third-level resistor disposed between the control line and a DC control.

5. The switch of claim 1 further comprising, for each transistor, a ladder resistor connected in parallel between the source and the drain of the transistor.

6. The switch of claim 1 wherein, for a central pair of transistors, the first node is connected by a capacitor to a drain of one transistor of the pair and to a source of the other transistor of the pair.

7. The switch of claim 6 wherein, for a first pair of transistors and a second pair of transistors of the number of transistors, the first and second pairs of transistors being equally spaced from and disposed on opposite sides of the central pair, a first capacitor connects a first node of the first pair to a drain of one transistor of the first pair and to a source of the other transistor of first pair, and a second capacitor connects a first node of the second pair to a drain of one transistor of the second pair and to a source of the other transistor of second pair.

8. The switch of claim 1 wherein the switch is defined in CMOS.

9. The switch of claim 1 wherein the switch is defined on a silicon-on-insulator die.

10. An RF device comprising:
a plurality of power amplifiers;
an antenna; and
an antenna switch configured to couple one of the plurality of power amplifiers at a time to the antenna, the antenna switch including, for each power amplifier, a serial switch comprising
an even number of transistors arranged in series, each transistor of the number of transistors having a source, a drain, and a gate, every two successive transistors defining a pair of transistors, the number of transistors being at least 4; and
a bias network including
a control line,
for each pair of transistors,
a first connection, including a first node, connecting the gates of the two transistors, the first connection including two first-level resistors, of equal resistance, disposed in series between the gates of the pair of transistors, and
for two pairs of transistors a second connection including a second node connecting the first nodes, the second node being coupled to the control line.

11. The RF device of claim 10 wherein the bias network is symmetric,
wherein half of the transistors are on one side of a line of symmetry and the other half of the transistors are on the other side of the line of symmetry, and
wherein the electrical paths through the bias network from a DC control to any two transistors located at a same distance from the line of symmetry are topologically equivalent.

12. The RF device of claim 10 wherein each second connection between the second node and each first node comprises a second-level resistor of a same resistance.

13. The RF device of claim 10 further comprising a third-level resistor disposed between the control line and a DC control.

14. The RF device of claim 10 further comprising, for each transistor, a ladder resistor connected in parallel between the source and the drain of the transistor.

15. The RF device of claim 10 wherein, for a central pair of transistors, the first node is connected by a capacitor to a drain of one transistor of the pair and to a source of the other transistor of the pair.

16. The RF device of claim 15 wherein, for a first pair of transistors and a second pair of transistors of the number of transistors, the first and second pairs of transistors being equally spaced from and disposed on opposite sides of the central pair, a first capacitor connects a first node of the first pair to a drain of one transistor of the first pair and to a source of the other transistor of first pair, and a second capacitor connects a first node of the second pair to a drain of one transistor of the second pair and to a source of the other transistor of second pair.

17. The RF device of claim 10 wherein the antenna switch is defined on a silicon-on-insulator die.

18. The RF device of claim 10 wherein the power amplifiers are defined on a first die and the antenna switch is defined on a second die.

* * * * *